US012695458B2

(12) United States Patent  (10) Patent No.: US 12,695,458 B2
Tandon et al.                  (45) Date of Patent:     Jul. 28, 2026

(54) DELAY LOCKED LOOP CIRCUIT

(71) Applicant: NXP USA, Inc., Austin, TX (US)

(72) Inventors: Prakhar Tandon, Hyderabad (IN);
                Shivesh Kumar Dubey, Hyderabad
                (IN); **Uma Maheswara Reddy
                Poreddy**, Hyderabad (IN)

(73) Assignee: NXP USA, Inc., Austin, TX (US)

( * ) Notice:   Subject to any disclaimer, the term of this
               patent is extended or adjusted under 35
               U.S.C. 154(b) by 0 days.

(21) Appl. No.: 18/823,347

(22) Filed:    Sep. 3, 2024

(65)              Prior Publication Data

US 2025/0175182 A1      May 29, 2025

(30)         Foreign Application Priority Data

Nov. 29, 2023    (IN) .............................. 202341081062

(51) Int. Cl.
     *H03L 7/081*          (2006.01)
     *H03L 7/089*          (2006.01)
(52) U.S. Cl.
     CPC .......... *H03L 7/0812* (2013.01); *H03L 7/0891*
                                              (2013.01)
(58) Field of Classification Search
     CPC ... H03L 7/0814; H03L 7/0816; H03L 7/0891;
             H03L 7/081; H03L 7/0812; H03K 5/133
     See application file for complete search history.

(56)              References Cited

U.S. PATENT DOCUMENTS 10,826,430  B2 *  11/2020  Ninomiya ............ H03B 5/1228
  10,965,293  B1     3/2021  Chang et al.
2012/0119802  A1 *   5/2012  Aremallapur ......... H03L 7/0816
                                                        327/158
2017/0163152  A1 *   6/2017  Holzmann ............ H02M 3/157

FOREIGN PATENT DOCUMENTS

CN          104113342 A  * 10/2014
  CN          112073059 A    12/2020
  EP          0487902 A2     6/1992

OTHER PUBLICATIONS

"Architectural Comparison of Analog and Digital Duty Cycle
Corrector for High Speed I/O Link", 2010 23rd International
Conference on VLSI Design, IE EE, Piscataway, NJ , USA, Jan. 3,
2010, pp. 270-275 (Year: 2010).*
                        (Continued)

*Primary Examiner* — James G Yeaman

(57)              ABSTRACT
A delay locked loop circuit comprising: a voltage-controlled
delay line (VCDL); a phase detector circuit that is config-
ured to process a first and a last output signal of the VCDL
in order to provide: i) an up-pulse signal; and ii) a down-
phase signal; a charge pump that is configured to provide a
feedback voltage signal based on the up-pulse signal and the
down-pulse signal; a phase signal processor that is config-
ured to process the up-pulse signal and the down-pulse
signal in order to provide a delay code locking signal, which
is representative of whether or not the first output signal is
2Π radians out of phase with the last output signal; a delay
code setter that is configured to provide a delay code setting
signal that represents one of a sequence of different candi-
date delay codes. The delay locked loop circuit may operate
in calibration and active modes.

9 Claims, 9 Drawing Sheets

(56)                References Cited

OTHER PUBLICATIONS

Jalalifar Majid et al. "A low-power low-jitter DLL with a differential closed-loop duty cycle corrector", Analog Integrated Circuits and Signal Processing, Springer New York LLC, US, vol. 93, No. 1, May 5, 2017, pp. 149-155.

Jovanovic, Goran et al.; "Voltage Controlled Delay Line for Digital Signal"; Facta Universitatis Series Elecontronics and Energetics; vol. 16, Aug. 2003; 19 pages.

Leneesh Raghavan et al. "Architectural Comparison of Analog and Digital Duty Cycle Corrector for High Speed I/O Link", 2010 23rd International Conference on VLSI Design, IEEE, Piscataway, NJ, USA, Jan. 3, 2010, pp. 270-275.

W.-M. Lin, K.-F. Teng and S.-I. Liu, "A delay-locked loop with digital background calibration," €2009 IEEE Asian Solid-State Circuits Conference, Taipei, Taiwan, 2009, pp. 317-320.

* cited by examiner

Increasing load_cal value

Delay b/w Feedback&refclk VS load_cal <3:0> in open- loop mode @ vcntrl =VDD/2 ( i/p time period = 1.3333ns )

At load_cal = 3 , cal_lock goes HIGH to LOW

DELAY LOCKED LOOP CIRCUIT

CROSS-REFERENCE TO RELATED APPLICATIONS

This application claims priority under 35 U.S.C. § 119 to Indian Patent Application number 202341081062, filed Nov. 29, 2023, the contents of which are incorporated by reference herein.

FIELD

The present disclosure relates to delay locked loop circuits.

SUMMARY

According to a first aspect of the present disclosure there is provided a delay locked loop circuit comprising:

a voltage-controlled delay line that comprises one or more variable components, wherein the voltage-controlled delay line is configured to:
 receive a clock-in signal;
 receive a control-voltage signal; and
 apply a time delay to the clock-in signal in order to provide a first output signal and a last output signal, wherein the magnitude of the time delay is based on the control-voltage signal and a delay code, and wherein the delay code defines the values of the one or more variable components in the voltage-controlled delay line;

a phase detector circuit that is configured to process the first output signal and the last output signal in order to provide: i) an up-pulse signal; and ii) a down-phase signal, wherein the difference between the width of the up-pulse signal and the width of the down-pulse signal represent the phase difference between the first output signal and the last output signal;

a charge pump that is configured to provide a feedback voltage signal based on the up-pulse signal and the down-pulse signal;

a phase signal processor that is configured to process the up-pulse signal and the down-pulse signal in order to provide a delay code locking signal, which is representative of whether or not the first output signal is 2Π radians out of phase with the last output signal;

a delay code setter that is configured to provide a delay code setting signal that represents one of a sequence of different candidate delay codes;

a fixed voltage source that is configured to provide a fixed voltage signal; and a switching circuit that is configured to put the delay locked loop circuit in either an active mode of operation or a calibration mode of operation, wherein:
 when the delay locked loop circuit is in the calibration mode of operation:
  the fixed voltage source is configured to provide the fixed voltage signal as the control-voltage signal for the voltage-controlled delay line;
  while the delay code locking signal represents the first output signal not being 2Π radians out of phase with the last output signal: the delay code setter is configured to apply the delay code setting signal to the voltage-controlled delay line such that it sequentially applies different candidate delay codes to the voltage-controlled delay line as an active delay code; and when the delay code locking signal represents the first output signal being 2Π radians out of phase with the last output signal: the delay code setter is configured to assign the active candidate delay code as a selected-delay-code; and
 when the delay locked loop circuit is in the active mode of operation:
  the charge pump is configured to provide the feedback voltage signal as the control-voltage signal for the voltage-controlled delay line; and
  the voltage-controlled delay line is configured to use the selected-delay-code as the delay code.

In one or more embodiments, the delay code setter is configured to apply the delay code setting signal to the voltage-controlled delay line such that it applies a sequence of candidate delay codes in which the value of the delay code gradually increases until the last output signal is at least 2Π radians out of phase with the first output signal.

In one or more embodiments, the phase signal processor comprises a D-type flip flop which has: a data input terminal, a clock input terminal, and an output terminal, wherein:
 the data input terminal is configured to receive one of the up-pulse signal and the down-pulse signal;
 the clock input terminal is configured to receive the other one of the up-pulse signal and the down-pulse signal; and
 the output terminal is configured to provide the delay code locking signal.

In one or more embodiments, the D-type flip flop further comprises an enable input terminal, and wherein:
 the enable input terminal is configured to receive an enable input signal when the delay locked loop circuit is in the calibration mode of operation; and
 the enable input terminal is configured to receive a disable input signal when the delay locked loop circuit is in the active mode of operation.

In one or more embodiments, the phase detector is a proportional phase detector.

In one or more embodiments, the delay locked loop circuit further comprises:
 a reset generator that is configured to ensure that the delay code setter receives a first rising edge of the last output signal before the corresponding rising edge of the first output signal before the delay code setter sequentially applies the different candidate delay codes to the voltage-controlled delay line.

In one or more embodiments, the voltage-controlled delay line comprises:
 a delay line bias circuit, wherein:
  the delay line bias circuit includes a resistor bank;
  the resistor bank comprises a plurality or resistors that are connected in series between a resistor-bank-connection node and a ground terminal, wherein the resistor bank has a resistance value that affects the magnitude of the time delay that is applied by the voltage-controlled delay line;
  the delay line bias circuit includes a plurality of bypass switches, each one associated with a resistor in the resistor bank;
  each bypass switch is configured to selectively include or exclude its associated resistor in the series arrangement between the resistor-bank-connection node and the ground terminal in order to set the resistance value of the resistor bank based on a resistive-code signal; and the delay line bias circuit comprises a controller that provides the resistive-code signals for each of the bypass switches based on the received delay code.

In one or more embodiments:

the voltage-controlled delay line comprises a plurality of delay buffers that are connected in series to successively apply a time delay to the clock-in signal;

the output of the first delay buffer is the first output signal;

the output of the last delay buffer is the last output signal; and the magnitude of the time delay that is applied by each delay buffer is based on a bias-voltage signal;

the delay line bias circuit further comprises a calibration transistor;

the resistance value of the resistor bank is configured to set the current through the calibration transistor; and the delay line bias circuit is configured to set the bias-voltage signal based on the current through the calibration transistor.

In one or more embodiments:

the voltage-controlled delay line comprises a plurality of delay buffers that are connected in series to successively apply a time delay to the clock-in signal;

each of the plurality of delay buffers has:

an input terminal;

an output terminal;

an intermediate terminal; and a duty cycle distortion reduction circuit that is connected in series between the intermediate terminal and the output terminal;

the duty cycle distortion reduction circuit comprises:

an ac-coupled capacitor and an inverter in series with each between the intermediate terminal and the output terminal, wherein the inverter has an inverter-input-terminal and an inverter-output-terminal;

a feedback resistor in series between the inverter-input-terminal and the inverter-output-terminal.

In one or more embodiments, the duty cycle distortion reduction circuit further comprises:

a first enable switch in series with the feedback resistor between the inverter-input-terminal and the inverter-output-terminal; and a second enable switch in series between the inverter-output-terminal and a ground terminal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A delay locked loop (DLL) circuit includes a delay chain that applies a time delay to an input clock signal. The DLL circuit also includes a feedback circuit that phase locks a last output signal to the input clock signal such that it is delayed by $2\Pi$ radians with reference to the input clock signal. The feedback circuit can include a phase detector and a charge pump. The delay chain can include a VCDL (voltage-controlled delay line). The magnitude of the time delay that is applied by the VCDL is influenced by a control voltage signal. The VCDL can have a limited range of acceptable control voltages due to limitations associated with a supply voltage and the charge pump's over drive voltage. Therefore, if the DLL's control voltage (vcntrl) exceeds a safe specified range then the DLL will be locked at an incorrect phase alignment. That is, the last output signal of the DLL will not be delayed by $2\Pi$ radians with reference to the DLL's input reference clock.

Figure 1:
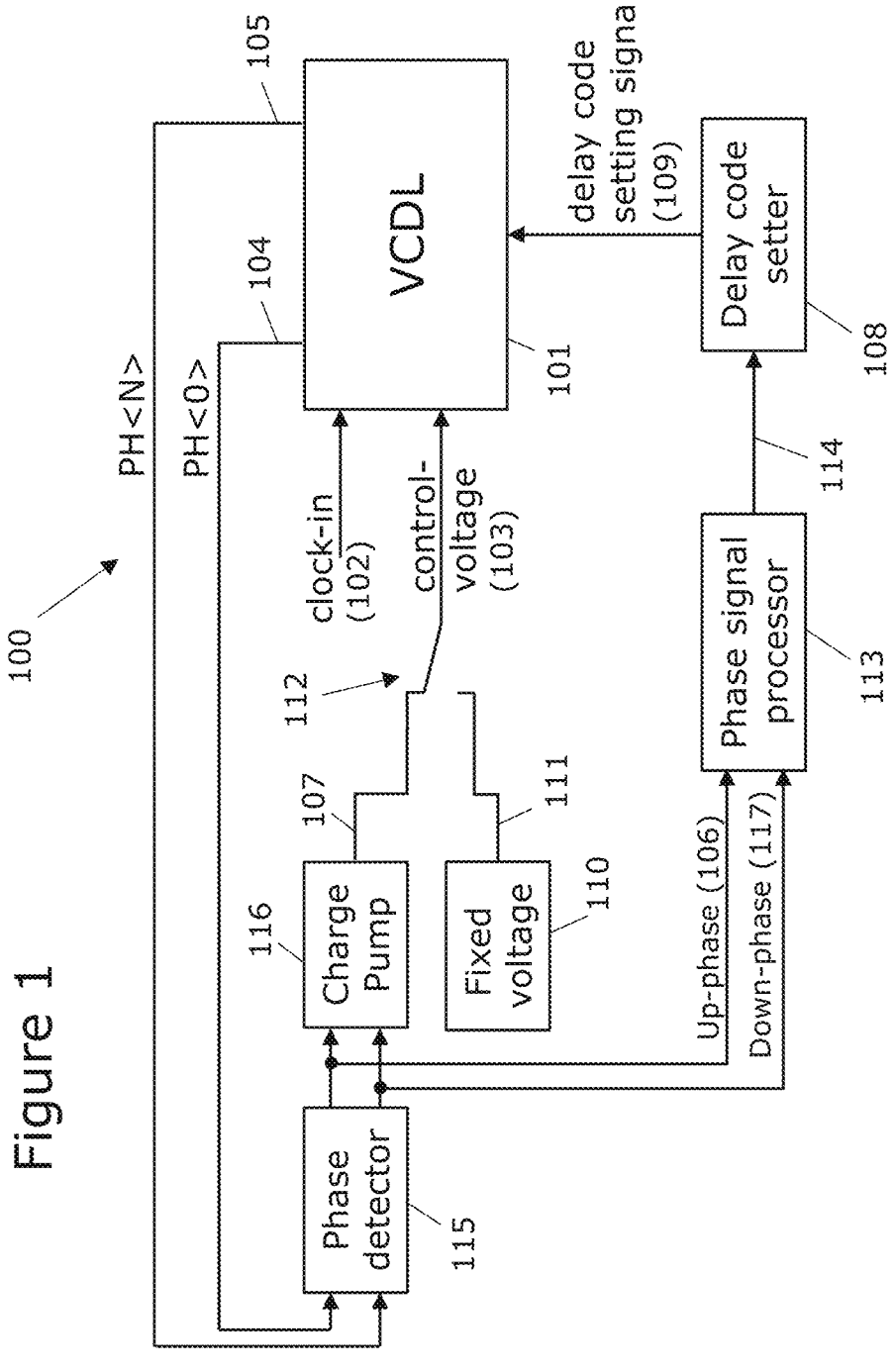
FIG. 1 illustrates an example embodiment of a delay locked loop (DLL) circuit according to the present disclosure.

FIG. 1 illustrates an example embodiment of a delay locked loop (DLL) circuit 100 according to the present disclosure. As will be discussed below, the DLL circuit 100 can be put in either an active mode of operation or a calibration mode of operation. In the calibration mode of operation, a voltage-controlled delay line (VCDL) 101 is calibrated such that a control voltage signal 103 that is applied to the VCDL 101 when the DLL circuit 100 is in the active mode of operation is expected to have a value that reduces the likelihood of it exceeding a range of acceptable values, which would result in incorrect operation of the DLL circuit 100. For example, the VCDL 101 can be calibrated such that the control voltage signal 103 is expected to have a value that is in the middle of an acceptable range of values when the DLL circuit is in the active mode of operation. Therefore, if anything happens that causes the control voltage signal 103 to increase or decrease (such as the temperature of the DLL circuit 100 changes), there is maximum headroom for the control voltage signal 103 to increase or decrease while still having a value that enables the DLL circuit 100 to apply the correct phase delay.

Figure 2:
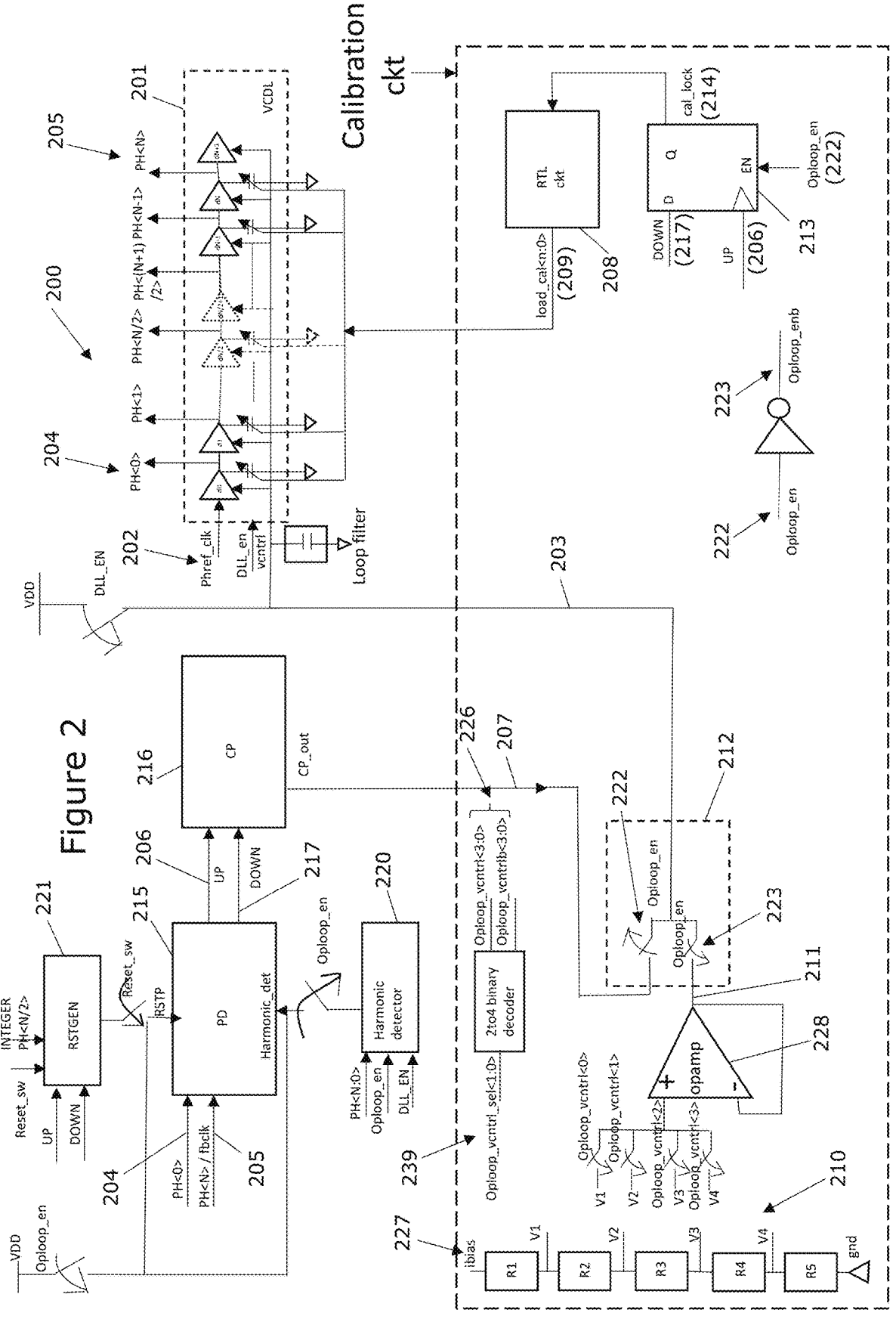
FIG. 2 shows another example of a DLL circuit according to the present disclosure.

Turning now to FIG. 1 in more detail, the VCDL 101 receives a clock-in signal 102 and a control-voltage signal 103. The VCDL 101 applies a time delay to the clock-in signal 102 in order to provide a first output signal (PH<0>) 104 and a last output signal (PH<N>) 105. In some examples, the first output signal (PH<0>) 104 may be the same signal as the clock-in signal 102 such that the VCDL 101 applies a time delay of zero in providing the first output signal (PH<0>) 104. When the DLL circuit 100 is in the active mode of operation, the last output signal (PH<N>) 105 should be delayed with reference to the first output signal (PH<0>) 104 such that there is a 2Π radian phase difference between the signals. In addition, as illustrated in FIG. 2, the VCDL 101 may also provide one or more intermediate output signals, PH<1> to PH<N–1>, (not shown in FIG. 1) that are phase shifted by less than 2Π radians with reference to the first output signal (PH<0>) 104.

The magnitude of the time delay that is applied by the VCDL 101 is based on the control-voltage signal 103 and also a delay code. The delay code defines the values of one or more variable components in the VCDL 101. In this way, the values of the one or more variable components influence the magnitude of the time delay that is applied by the VCDL 101. As will be described below, the variable components may include variable resistors and/or variable capacitors, although it will be appreciated that any type of variable component that influences the time delay can be used.

The DLL circuit 100 also includes a phase detector 115 and a charge pump 116 that provide a feedback voltage signal 107 based on the phase difference between the first output signal (PH<0>) 104 and the last output signal (PH<N>) 105. In this example, the phase detector 115 is a proportional phase detector. As is known in the art, the phase detector 115 processes the first output signal (PH<0>) 104 and the last output signal (PH<N>) 105 in order to provide: i) an up-pulse signal 106; and ii) a down-pulse signal 117. The difference in time between a rising edge of the up-pulse signal 106 and a rising edge of the down-pulse signal 117 reflect the phase difference between the first output signal (PH<0>) 104 and the last output signal (PH<N>) 105. The charge pump provides the feedback voltage signal 107 based on the up-pulse signal 106 and the down-pulse signal 117.

The DLL circuit 100 also includes a fixed voltage source 110 that provides a fixed voltage signal 111. As will be discussed below: the fixed voltage signal 111 is provided as the control-voltage signal 103 when the DLL circuit 100 is in the calibration mode of operation; and the feedback voltage signal 107 is provided as the control-voltage signal 103 when the DLL circuit 100 is in the active mode of operation. In this way, the DLL circuit 100 is in an open loop configuration when it is in the calibration mode of operation and it is in a closed loop configuration when it is in the active mode of operation.

The DLL circuit 100 also includes a delay code setter 108 that provides a delay code setting signal 109 to the VCDL 101. At any moment in time when the DLL circuit 100 is in the calibration mode of operation, the delay code setting signal 109 represents one of a sequence of different candidate delay codes. The delay code setter 108 is for calibrating the VCDL 101 when the DLL circuit 100 is in the calibration mode of operation.

As shown in FIG. 1, the DLL circuit 100 also includes a switching circuit 112. The switching circuit 112 is for putting the DLL circuit 100 in either an active mode of operation or a calibration mode of operation. In FIG. 1, the switching circuit 112 is implemented as a single switch. However, in other examples, including the example of FIG. 2, more than one switching component may be used to control the mode of operation of the DLL circuit 100.

When the DLL circuit 100 is in the calibration mode of operation, the switching circuit 112 connects the fixed voltage source 110 to the VCDL 101. The switching circuit

112 also disconnects the charge pump 116 from the VCDL 101. In this way, the fixed voltage source 110 provides the fixed voltage signal 111 as the control-voltage signal 103 for the VCDL 101. As will be discussed below, in one example the fixed voltage signal 111 can have a value that is midway through a range of voltage values that enable the DLL circuit 100 to function correctly. This can be implemented by providing a number of voltage signals that are near to the middle of the supply voltage supply, as shown with a resistor divider in FIG. 2.

The delay code setter 108 is used to sequentially apply different candidate delay codes to the VCDL 101 until one is found that results in the last output signal (PH<N>) 105 being 2Π radians out of phase with the first output signal (PH<0>) 104. As will be discussed in detail below, in one example the delay code setter 108 applies a sequence of candidate delay codes for which the value of the delay code gradually increases. The value of the delay code that is applied gradually increases until the last output signal (PH<N>) 105 is at least 2Π radians out of phase with the first output signal (PH<0>) 104. This functionality can be performed in combination with a reset generator, which ensure that the delay code setter 108 catches the first rising edge of PH<N> before the corresponding rising edge of PH<0>. In that way, the width of a pulse in the down-pulse signal 117 will increase to more than the width of a pulse in the up-pulse signal 106 because a rising edge of the down-pulse signal 117 comes before the up-pulse signal 106, as provided by the phase detector 115. Now, if the delay code setter 108 will increase the delay then ph<N> will be delayed more; that is, it will be moved towards 2Π phase shifting direction with respect to ph<0>. Hence, the rising edge of the down-pulse signal 117 will move towards the rising edge of the up-pulse signal 106. This means that the width of the pulse in the down-pulse signal 117 will reduce as a higher delay is applied by the delay code setter 108. At a specific delay setter value during the increment, the rising edge of PH<N> will just cross the rising edge of PH<0> due to the imposed higher delay in the VCDL 101, and at that time the width of the pulse in the down-pulse signal 117 will be less than the width of the pulse in the up-pulse signal 106.

In FIG. 1, a phase signal processor 113 is used to provide the delay code setter 108 with a delay code locking signal 114, which is representative of whether or not the first output signal (PH<0>) 104 is 2Π radians out of phase with the last output signal (PH<N>) 105. The phase signal processor 113 processes the up-pulse signal 106 and the down-pulse signal 117 in order to provide the delay code locking signal 114. This can be considered advantageous because it reuses signals that are generated during the active mode of operation, and therefore requires only minimal additional processing in order to implement the calibration mode of operation.

More specifically, when the DLL circuit 100 is in the calibration mode of operation:

while the delay code locking signal 114 represents the first output signal (PH<0>) 104 not being 2Π radians out of phase with the last output signal (PH<N>) 105, the delay code setter 108 applies the delay code setting signal 109 to the VCDL 101 such that it sequentially applies one or more of the sequence of different candidate delay codes to the voltage-controlled delay line as an active delay code; and when the delay code locking signal 114 represents the first output signal (PH<0>) 104 being 2Π radians out of phase with the last output signal (PH<N>) 105, the delay code setter 108 assigns the active candidate delay code as a selected-delay-code.

When the DLL circuit 100 is in the active mode of operation, the switching circuit 112 connects the charge pump 116 to the VCDL 101. The switching circuit 112 also disconnects the fixed voltage source 110 from the VCDL 101. In this way, the charge pump 116 provides the feedback voltage signal 107 as the control-voltage signal 103 for the VCDL 101.

Also when the DLL circuit 100 is in the active mode of operation, the VCDL 101 uses the selected-delay-code (i.e., the one that was determined during the calibration mode of operation) as the delay code. That is, the variable components in the VCDL 101 are set such that they have values that are consistent with those that were identified during the calibration mode of operation as resulting in the last output signal (PH<N>) 105 being 2Π radians out of phase with the first output signal (PH<0>) 104. The DLL circuit 100 can then operate in a closed loop configuration in the active mode of operation such that the value of the feedback voltage signal 107 is expected to have the same value as the fixed voltage signal 111 in order to achieve the desired phase difference of 2Π radians between the first output signal (PH<0>) 104 and the last output signal (PH<N>) 105. Then, if there are any temperature variations during operation of the DLL circuit 100 in the active mode of operation, the DLL circuit 100 is well-placed to accommodate any associated changes in the feedback voltage signal 107 that occur as a result of the closed loop configuration without saturating the control of the VCDL 101.

Advantageously, the example of FIG. 1 can limit the control voltage signal 103 across variations in PVT (process, voltage temperature). In this example, it can achieve this by calibrating an RC delay (by applying the candidate delay codes) to maintain the control voltage signal at a value that is in the middle of the supply voltage (e.g., VDD/2) while the charge pump 116 is disabled or disconnected. In other examples, the control voltage signal can be maintained at a different value, which may or may not be near to VDD/2. Such a control voltage can be provided by a resistor divider (as shown in FIG. 2) or any bias generation voltage source. Either way, the DLL circuit 100 can vary the RC delay of the VCDL 101 until the DLL's last output signal 105 is 2Π radians apart from first output signal 104. Once the calibrated RC value is determined, the DLL circuit enters into a closed loop mode of operation (referred to above as an active mode of operation) using the final calibrated RC value of the VCDL 101 to lock near to the fixed value of the control voltage signal that was used in calibration mode, which may be VDD/2.

FIG. 2 shows another example of a DLL circuit 200 according to the present disclosure. Features of FIG. 2 that are also shown in FIG. 1 have been given corresponding reference numbers in the 200 series, and will not necessarily be described again here. As will be discussed below, the DLL circuit 200 includes a calibration-mode-enable signal (Oploop_en) 222 that is set: high when the DLL circuit 200 is to be put in the calibration mode of operation; and low when the DLL circuit 200 is to be put in the active mode of operation. The DLL circuit 200 also generates and uses the inverse of the calibration-mode-enable signal (Oploop_enb) 223.

The VCDL 201 is implemented as a chain of N+2 delay buffers in series with each other in this example. The first buffer in the chain receives the clock-in signal 202 as an input signal and provides the first output signal (PH<0>) 204 as its output signal. The penultimate buffer in the chain provides the last output signal (PH<N>) 205 as its output signal. As shown in FIG. 2, a variable capacitor is respectively connected between the output terminals of each of the first to the penultimate buffers and a ground terminal. In the same way that is described above with reference to FIG. 1, the values of the variable capacitors are set by a delay code. Therefore, a variable component (a variable capacitor in this example, although it could be a variable resistor or any other suitable type of variable component) is associated with each buffer such that it contributes to defining the magnitude of the time delay that is applied by each buffer in the VCDL 201.

In this example, each of the first to the penultimate buffers provides an output signal that is a phase shifted version of the clock-in signal 202. Since each of the buffers applies the same amount of delay in this example, the phase of each of the output signals is equally shifted with respect to the earlier output signal in the phase, and if the DLL circuit 200 is operating correctly the last output signal 205 is phase shifted by 2Π radians with respect to the first output signal 204.

The DLL circuit 200 in this example includes a phase detector 215 and a charge pump 216. The phase detector 215 compares the first output signal (PH<0>) 204 and the last output signal (PH<N>) 205 and, depending up on the result of the comparison, it sets the width of an up-pulse signal 206 and the width of a down-pulse signal 217 such that they represent the phase difference between the first output signal 204 and the last output signal 205. As is known in the art, the up-pulse signal 206 and the down-pulse signal 217 are used to control the charge pump 216 such that it either increases or decreases the feedback voltage signal 207 that is provided as the output signal of the charge pump 216. In this way, when the DLL circuit 200 is in the active mode of operation, the charge pump 216 sets the feedback voltage signal 207 such that the first output signal (PH<0>) 204 and the last output signal (PH<N>) 205 are brought into phase with each other. Due to the time delay that is applied by the VCDL 201, this should mean that the last output signal (PH<N>) 205 is phase shifted by 2Π radians with respect to the first output signal (PH<0>) 204.

The fixed voltage source 210 in this example is configurable such that the voltage level of the fixed voltage signal 211 can be set by a user. In FIG. 2, the fixed voltage source 210 includes a potentiometer 227 (that can also be referred to as a resistive divider). It will be appreciated that in other examples the fixed voltage source 210 may be implemented differently, and that it can include any bias voltage design. The fixed voltage source 210 receives a calibration-voltage-control-signal 239, which defines a required level for the voltage of the fixed voltage signal 211. In this example, the DLL circuit 200 converts the calibration-voltage-control-signal 239 into four binary signals 226 that are used to control four corresponding switches. Each of these four switches is connected to a different node in the potentiometer 227 such that a different voltage level can be tapped off and connected to an input terminal of an operational amplifier (op-amp) 228. The op-amp 228 is configured as a unity gain amplifier such that the output signal of the op-amp 228 is the fixed voltage signal 211.

The DLL circuit 200 of FIG. 2 includes a control-voltage-connection-switch 212, which is part of a switching circuit for controlling the mode of operation of the DLL circuit 200. In the same way as FIG. 1, the control-voltage-connection-switch 212 provides either the fixed voltage signal 211 or the feedback voltage signal 207 as the control-voltage signal 203 for the VCDL 201.

The delay code setter block 208 of FIG. 2 is implemented as an RTL (resistor transistor logic) circuit. The delay code setter block 208 provides a delay code setting signal (load_cal<n:0>) 209 that periodically applies the next candidate delay code in a sequence to the VCDL 201. In this example, the delay code setter block 208 starts with the lowest candidate delay code and gradually increments the value of the candidate delay code until a code is applied that results in the last output signal (PH<N>) 205 being 2Π radians out of phase with the first output signal (PH<0>) 204. As will be discussed below, a phase signal processor 213 processes the up-pulse signal 206 and the down-pulse signal 217 in order to provide a delay code locking signal 214 to the delay code setter block 208 that indicates when the last output signal (PH<N>) 205 is 2Π radians out of phase with the first output signal (PH<0>) 204.

In this example, the phase signal processor comprises a D-type flip flop 213. The D-type flip flop 213 has a data input terminal, a clock input terminal, and an output terminal. The data input terminal receives the down-pulse signal 217, and the clock input terminal receives the up-pulse signal 206. The output terminal provides the delay code locking signal 214. In this way, the down-pulse signal 217 is sampled with respect to the up-pulse signal 206 such that the delay code locking signal 214: has a value of 1 when the first output signal (PH<0>) 204 is not in-phase with the last output signal (PH<N>) 205; and has a value of 0 when the first output signal (PH<0>) 204 is in-phase with the last output signal (PH<N>) 205. Example waveforms that illustrate this functionality are described below with reference to FIG. 5.

It will be appreciated that the signals that are provided to the input terminals of the D-type flip flop 213 could be reversed such that, along with corresponding changes to other components of the DLL circuit 200, the same functionality can be achieved. The value of the delay code locking signal 214 will either toggle 1→0 or 0→1 at the required delay code (i.e., when PH<N> will be 2Π radians apart from PH<0>), depending on which signal is provided to which of the input terminals of the D-type flip flop 213.

The D-type flip flop 213 also includes an enable input terminal. The enable input terminal receives an enable input signal 222 when the DLL circuit 200 is in the calibration mode of operation. The enable input signal 222 represents a disable input signal when the DLL circuit 200 is in the active mode of operation. In this way, the D-type flip flop 213 only samples the down-pulse signal 217 with respect to the up-pulse signal 206 when the DLL circuit 200 is in the calibration mode of operation.

Figure 3:
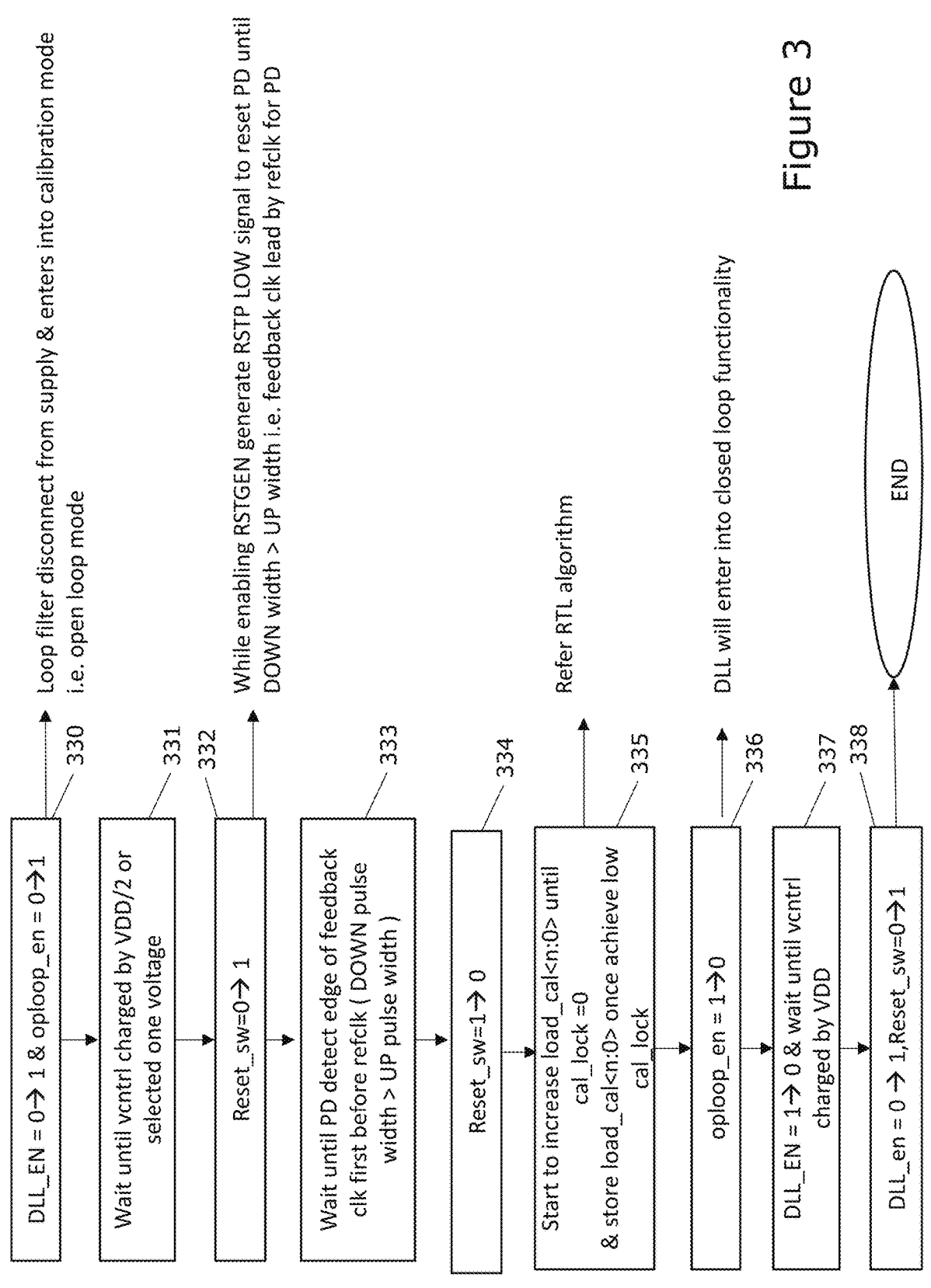
FIG. 3 illustrates a flow chart for a calibration sequence that can be performed by the DLL circuit of FIG. 2.

FIG. 3 illustrates a flow chart for a calibration sequence that can be performed by the DLL circuit of FIG. 2. The names of signals that are included in FIG. 3 are also shown in FIG. 2.

At step 330, the DLL circuit is enabled by setting a DLL_EN signal to logic 1. As can be seen from FIG. 2, setting this signal in this way opens a switch to disconnect the control voltage signal 203 signal from the VDD supply.

Also at step 330, the calibration-mode-enable signal (Oploop_en) 222 is set to a logic high value. As discussed in detail above, this puts the DLL circuit 200 into the calibration mode of operation. When the calibration-mode-enable signal (Oploop_en) 222 is set to a high value:

the fixed voltage signal 211 is provided as the control-voltage signal 203 for the VCDL 201; and.

the D-type flip flop 213 associated with the delay code setter 208 is enabled.

In addition, a harmonic detector 220 is disconnected from the phase detector 215 when the calibration-mode-enable signal (Oploop_en) 222 is set to a logic high value. Since the functionality of the harmonic detector 220 is not core to the calibration functionality of the present disclosure, we will not describe it in further detail here.

In this way, at step 330 the loop filter is disconnected from the supply and the DLL circuit 200 enters into the calibration mode of operation, which in this example is an open loop mode.

The calibration sequence then waits at step 331 until the control voltage signal 203 is charged to VDD/2 or another predetermined voltage that is provided by the fixed voltage source 210.

The DLL circuit 200 of FIG. 2 also includes a reset generator 221, which is known in the art. We will briefly describe the operation of the reset generator 221 with reference to steps 332-334 of FIG. 3.

At step 332, a Reset_sw signal is changed from a logic low value to a logic high value. As can be seen from FIG. 2, this closes a switch between the reset generator 221 and the phase detector 215. When this switch is closed, the reset generator 221 is enabled such that it generates a RSTP LOW signal to reset the phase detector 215 until the phase detector 215 detects a first rising edge of PH<N> before PH<0>, which means that the width of the down-pulse signal 217 is greater than the width of the up-pulse signal 206 at step 333. That is, until the phase of the last output signal (PH<N>) 205 leads the phase of the first output signal (PH<0>) 204. The Reset_sw signal is then changed from a logic high value to a logic low value to signify the end of the reset operation. It will be appreciated from the description that follows that this represents a suitable starting point for starting to increase the delay codes. This is because the next time that the first output signal (PH<0>) 204 and the last output signal (PH<N>) 205 are in-phase with each other, the last output signal (PH<N>) 205 will be phase-delayed with reference to the first output signal (PH<0>) 204 by 2Π radians.

At step 335, the delay code setter block 208 determines the selected-delay-code as the value of load_cal<n:0> when the delay code locking signal 214 is triggered. The functionality of step 335 is described in more detail below with reference to FIG. 4.

At step 336, the calibration-mode-enable signal (Oploop_en) 222 is set to a logic low value such that the DLL circuit 200 enters the active, closed loop, mode of operation and:

the feedback voltage signal 207 is provided as the control-voltage signal 203 for the VCDL 201;

the D-type flip flop 213 associated with the delay code setter 208 is disabled; and.

the VCDL 201 uses the selected-delay-code.

At step 337, the DLL circuit is disabled by setting the DLL_EN signal to logic 0, such that the control voltage signal 203 will tend towards the supply voltage, VDD. The flow chart then waits for the control voltage signal 203 to reach the supply voltage, VDD, and at step 338 the DLL circuit is reenabled by setting the DLL_EN signal to logic 1. Also at step 338, the Reset_sw signal is changed from a logic low value to a logic high value.

The DLL circuit 200 has now been calibrated and is in an active mode of operation. Hence, in the closed loop, active mode of operation the DLL circuit 200 will be locked such that the selected control voltage signal (vcntrl) 203 has a value that is similar to the one that was used in the open loop calibration mode of operation (e.g., VDD/2) by keeping the same delay code (load_cal) value at which the delay code locking signal (cal_lock) 214 toggles from high to low. As discussed above, the value of cal_lock 214 toggles depending on the UP and DOWN pulses at the input terminals of the D-type flip flop 213.

Figure 4:
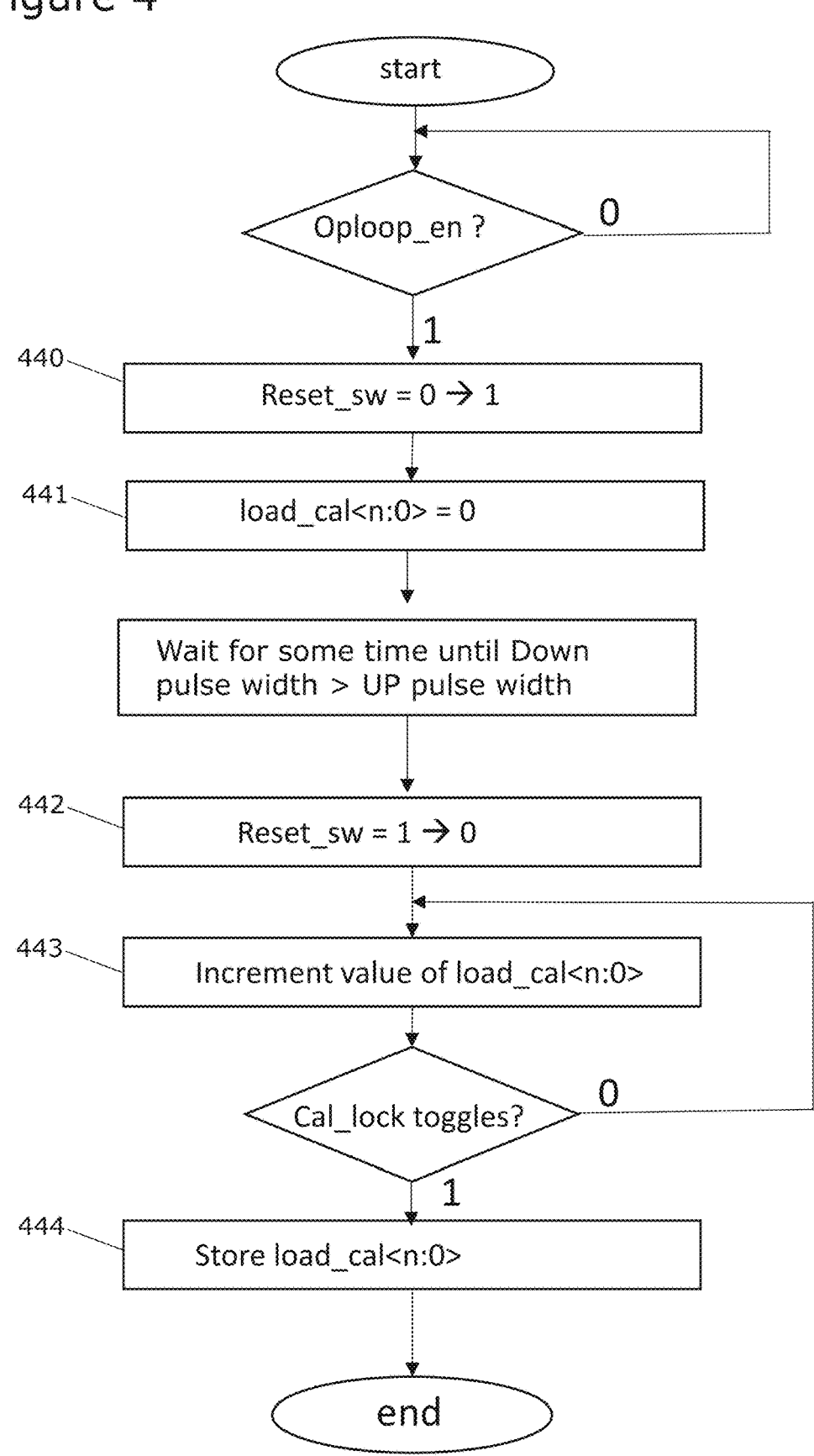
FIG. 4 is a flow chart that illustrates the functionality of step 335 of FIG. 3 in more detail.

FIG. 4 is a flow chart that illustrates the functionality of step 335 of FIG. 3 in more detail. Therefore, FIG. 4 illustrates how the delay code setter block 208 of FIG. 2 determines the selected-delay-code.

The flow chart of FIG. 4 includes an initial step of checking if the calibration-mode-enable signal (Oploop_en) 222 has a logic high value, which indicates that the DLL circuit 200 is in the calibration mode of operation. If the calibration-mode-enable signal (Oploop_en) 222 does have a logic high value, then the flow chart moves on to: step 440 where the Reset_sw signal is changed from a logic low value to a logic high value; and step 441 where the delay code setting signal (load_cal<n:0>) 209 is initialised by setting it to a first candidate delay code. In this example, the first candidate delay code is zero.

Then, the flow chart waits some time until the down pulse width is greater than the up pulse width before the flow chart continues. When this is the case, the Reset_sw signal is changed from a logic high value to a logic low value at step 442.

At step 443, the delay code setter 208 increments the delay code setting signal (load_cal<n:0>) 209 such that it represents the next candidate delay code in the sequence. As discussed above, this represents increasing the value of the delay code setting signal (load_cal<n:0>) 209.

While the delay code locking signal (cal_lock) 214 has not been toggled, which represents the first output signal (PH<0>) 204 not being 2Π radians out of phase with the last output signal (PH<N>) 205, the flow chart returns back to step 443 to periodically increment the delay code setting signal (load_cal<n:0>) 209 such that it represents the next candidate delay code in the sequence. In this way, the delay code setter 208 sequentially applies the sequence of different candidate delay codes to the VCDL 201 as an active delay code.

This continues until the delay code locking signal (cal_lock) 214 toggles from 0→1 or 1→0 (depending upon how the signals are connected to the input terminals of the D-type flip flop 213), which represents the first output signal (PH<0>) being 2Π radians out of phase with the last output signal (PH<N>). At which point, the flow chart continues to step 444 where the delay code setter 208 effectively assigns the active candidate delay code as the selected-delay-code by storing the delay code setting signal (load_cal<n:0>) 209.

As discussed above, it is this selected-delay-code that will be used by the VCDL 201 in the active mode of operation.

Figure 5:
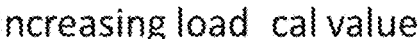
FIG. 5 shows a timing diagram that further illustrates the functionality of the flow chart of FIG. 4.

FIG. 5 shows a timing diagram that further illustrates the functionality of the flow chart of FIG. 4.

The uppermost plot in FIG. 5 is the first output signal (PH<0>) 504, which, as discussed above, is one of the input signals to the phase detector 215.

The second, third and fourth plots in FIG. 5 represent operation of the DLL circuit of FIG. 2 when it receives a delay code setting signal 209 having a value that represents the first candidate delay code; i.e., load_cal=0. The second plot is the last output signal (PH<N>) 505a, which is the other input signal to the phase detector 215. The third plot is the down-pulse signal 517a, which is an output signal of the phase detector 215 and is also one of the input signals to the D-type flip flop 213. The fourth plot is the up-pulse signal 506a, which is another output signal of the phase detector 215 and is also the other input signal to the D-type flip flop 213.

The first and second plots in FIG. 5 illustrate that the last output signal (PH<N>) 505a has not been sufficiently delayed with respect to the first output signal (PH<0>) 504 because they are not 2Π radians out of phase with each other. It can also be seen that when the D-type flip flop 213 samples the down-pulse signal 517a using the up-pulse signal 506a as a clock signal, such that the output signal of the D-type flip flop 213 will have a logic high signal. This is because the down-pulse signal 517a has a logic high value at the rising edge in the up-pulse signal 506a.

The fifth and sixth plots in FIG. 5 represent operation of the DLL circuit of FIG. 2 when it receives a delay code setting signal 209 that represents a delay code that is in between the first candidate delay code and what will turn out to be the selected-delay-code; i.e., load_cal=x, as it is shown in FIG. 5. That is, the fifth and sixth plots represent operation of the DLL circuit during the calibration mode of operation, which is later in time than that represented by the second, third and fourth plots. The fifth plot is the last output signal (PH<N>) 505b. The sixth plot is the down-pulse signal 517b. The first and fifth plots in FIG. 5 illustrate that the last output signal (PH<N>) 505b has still not been sufficiently delayed with respect to the first output signal (PH<0>) 504 because they are not 2Π radians out of phase with each other. When the D-type flip flop 213 samples the down-pulse signal 517b that occurs for load_cal=x using the up-pulse signal 506a as a clock signal, the output signal of the D-type flip flop 213 will still have a logic high signal.

The seventh, eighth and ninth plots in FIG. 5 represent operation of the DLL circuit of FIG. 2 when it receives a delay code setting signal 209 having a value that represents the selected-delay-code; i.e., load_cal=locking load_cal, as it is shown in FIG. 5. The operation that is represented by the seventh, eighth and ninth plots in FIG. 5 are later in time than that represented by the fifth and sixth plots.

The seventh plot is the last output signal (PH<N>) 505c. The eighth plot is the down-pulse signal 517c. The ninth plot is the up-pulse signal 506c. The first and seventh plots in FIG. 5 illustrate that the last output signal (PH<N>) 505a has now been sufficiently delayed with respect to the first output signal (PH<0>) 504 because they are slightly more than 2Π radians out of phase with each other. It can also be seen that when the D-type flip flop 213 samples the down-pulse signal 517c using the up-pulse signal 506c as a clock signal, the output signal of the D-type flip flop 213 will have a logic low signal. This is because the down-pulse signal 517a has a logic low value at the rising edge in the up-pulse signal 506c. Therefore, the candidate delay code that was used when the seventh, eighth and ninth plots in FIG. 5 were generated represents the desired active delay code.

To summarise aspects of the above disclosure, vcntrl is kept close to VDD/2 during the calibration mode of operation, and load_cal<n:0> is varied from 0 until the cal_lock signal goes high to low. While increasing the load_cal value, DOWN pulse width will reduce. Further increments of load_cal<n:0> results in the DOWN pulse overlapping with the UP pulse when refclk and feedback clk are 360 degrees apart. Hence, we can say that feedback clk approaches refclk, and as soon as feedback clk crosses refclk this means that the feedback clk is 360 degrees apart from the refclk and UP pulse width>DOWN pulse width. This is the lock condition for this particular process. The value at which cal_lock signal will toggle, ph<N> will be delayed by close to one cycle with respect to ph<0>. Hence, over that transition code, ph<N> will be delayed by close to Tclk with respect to ph<0>.

Figure 6:
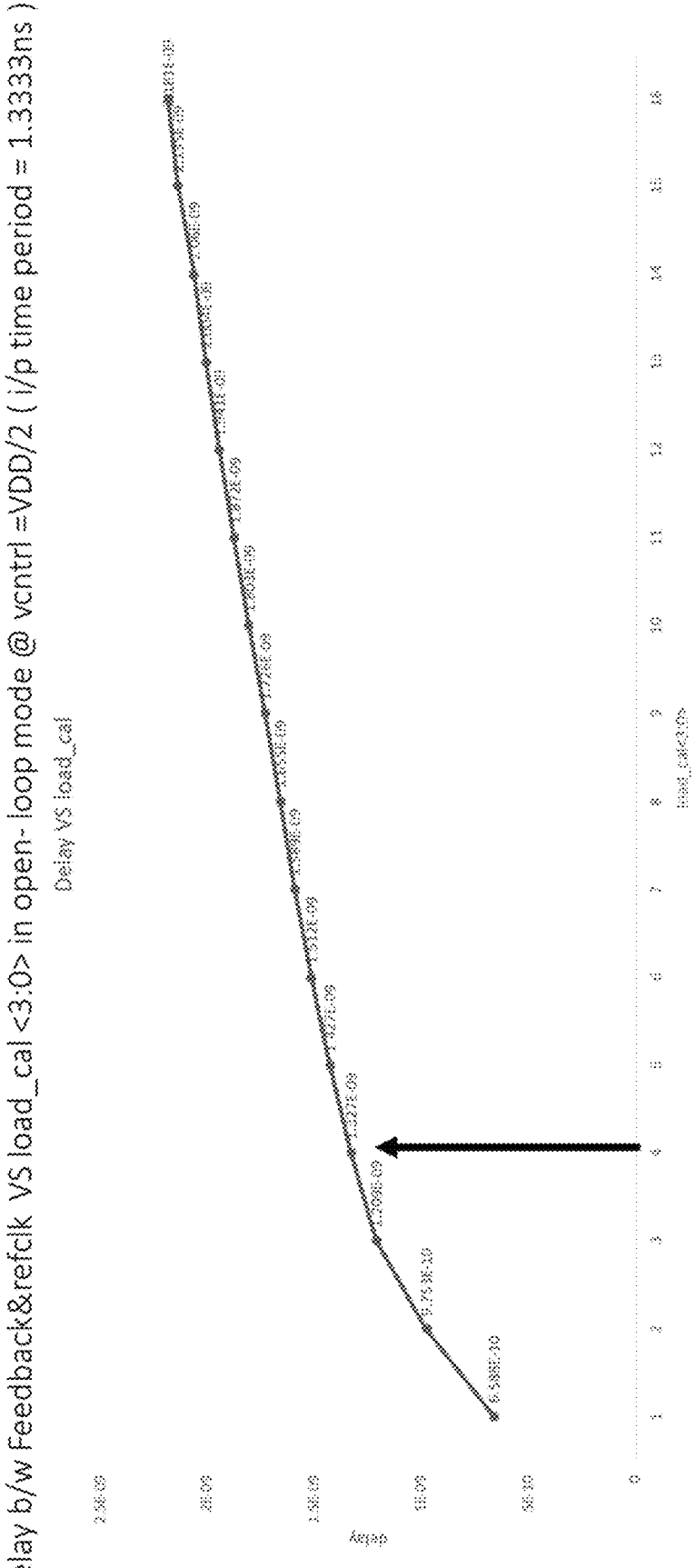
FIG. 6 shows a plot of candidate delay code index (load_cal<3:0>) on the horizontal axis versus time delay on the vertical axis.

FIG. 6 shows a plot of candidate delay code index (load_cal<3:0>) on the horizontal axis, where each index represents a different candidate delay code in the sequence. In this example, a sequence of 16 candidate delay codes is shown. Time delay for the entire VCDL in seconds is shown on the vertical axis.

For the plot of FIG. 6, the fourth candidate delay code is identified as the selected-delay-code, which corresponds to a time delay of 1.3333 ns.

Figure 7:
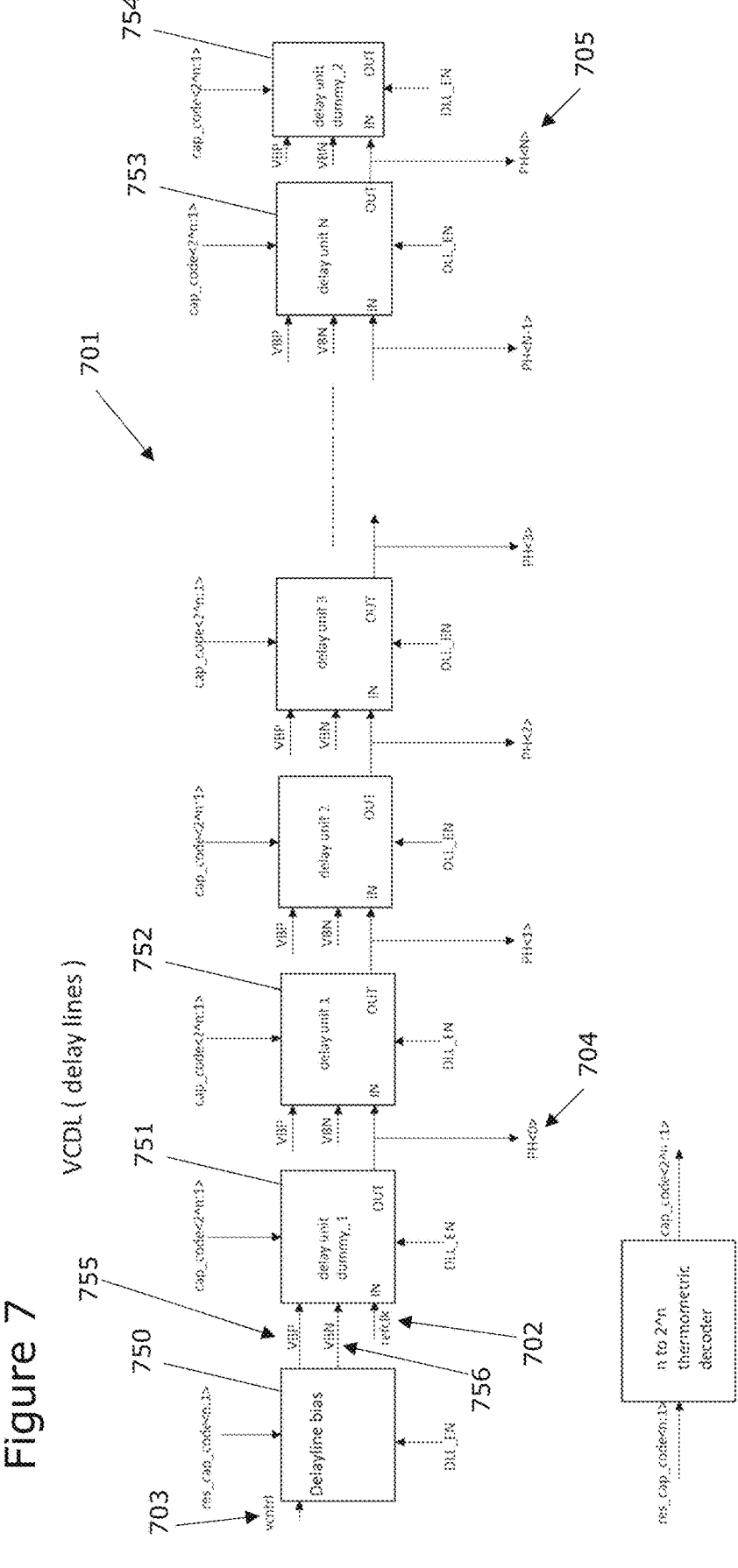
FIG. 7 illustrates an example embodiment of a VCDL 701 according to the present disclosure.

FIG. 7 illustrates an example embodiment of a VCDL 701 according to the present disclosure.

The VCDL 701 includes a chain of delay buffers in series with each other. The chain includes:

a first dummy delay buffer 751, which receives the clock-in signal (refclk) 702 and provides an output signal that is a delayed version of the clock-in signal (refclk) 702;

N delay buffers 752-753, which are connected in series to successively apply a delay to the output signal from the first dummy delay buffer 751. Each of the N delay buffers 752-753 provides an output signal that is a phase-delayed version of the clock-in signal (refclk) 702. The output of the first delay buffer 752 is the first output signal (PH<0>) 704. The output of the last, $N^{th}$, delay buffer 753 is the last output signal (PH<N>) 705; and a last dummy delay buffer 754, which receives the last output signal (PH<N>) 705 from the last, $N^{th}$, delay buffer 753.

The first and last dummy delay buffers 751, 754 are used to get less skew between the phase detector's input, i.e. PH<0> and PH<N>, because of match fan-in/fan-out.

FIG. 7 shows that each of the delay buffers receives a cap_code<2$^n$:1> signal, which can be referred to as a capacitive-code signal. The value of the cap_code<2$^n$:1> signal is set according to the delay code locking signal (load_cal<n:0> signal) that is received from the delay code setter block. (The res_cap_code<n:1> signal that is shown in FIG. 7 is another name for the load_cal<n:0> signal that is described above.) In this example, this includes use of an n to 2^n thermometric decoder which converts a res_cap_code<n:1> signal into the cap_code<2$^n$:1> signal. Each of the delay buffers includes a variable capacitor (an example of which is labelled with reference number 862 in FIG. 8), and the capacitance value of each variable capacitor is set based on the cap_code<2$^n$:1> signal (capacitive-code signal).

FIG. 7 also shows a delay line bias circuit 750. The delay line bias circuit 750 receives the control voltage signal 703 and provides a first-bias-voltage signal (VBP) 755 and a second-bias-voltage signal (VBN) 756 to each of the delay buffers. In this example, the first-bias-voltage signal (VBP) 755 is provided for PMOS transistors and the second-bias-voltage signal (VBN) 756 is provided for NMOS transistors. The delay line bias circuit 750 sets the values of the first-bias-voltage signal (VBP) 755 and the second-bias-voltage signal (VBN) 756 based on a res_code<2$^n$:1> signal, which can be referred to as a resistive-code signal and will be described with reference to FIG. 8. The res_code<2$^n$:1> signal in this example is provided by an n to 2$^n$ binary decoder converting the res_cap_code<n:1> signal, as also shown in FIG. 8.

The res_cap_code<n:1> signal is used for calibration purpose across process and variation to limit the control voltage signal (vcntrl) 703 both in the delay line bias circuit 750 and the delay buffers, and also to control current and capacitor values in the delay buffers.

Figure 8:
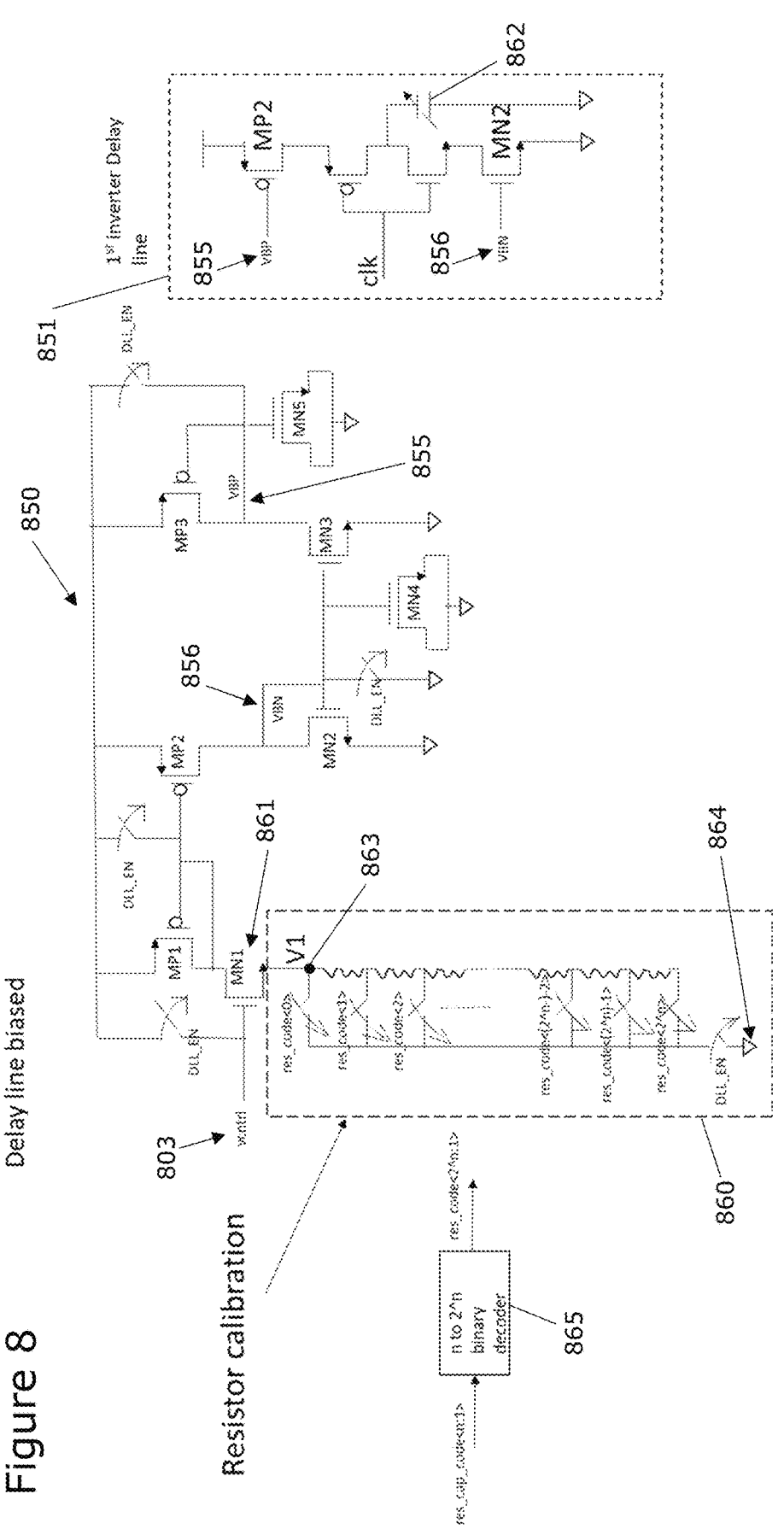
FIG. 8 shows additional details of a delay line bias circuit, such as the one of FIG. 7, according to an embodiment of the present disclosure.

FIG. 8 shows additional details of a delay line bias circuit 850, such as the one of FIG. 7, according to an embodiment of the present disclosure.

As shown in FIG. 8, the delay line bias circuit 850 includes a resistor bank 860. The resistor bank 860 includes a plurality or resistors that are connected in series between a resistor-bank-connection node (V1) 863 and a ground terminal 864. As will be discussed below, wherein the resistor bank 860 has a resistance value that affects the magnitude of the time delay that is applied by the VCDL.

The delay line bias circuit 850 also includes a plurality of bypass switches, each one associated with a resistor in the resistor bank 860. Each bypass switch is configured to selectively include or exclude its associated resistor in the series arrangement between the resistor-bank-connection node (V1) 861 and the ground terminal 864. In this example, each bypass switch selectively connects a node between adjacent resistors to the ground terminal 864. The bypass switches can be opened and closed in accordance with a resistive-code signal (res_code<2$^n$:1>)) in order to set the resistance value of the resistor bank 860.

The delay line bias circuit 850 also includes a controller 865 that provides the resistive-code signals (res_code<2$^n$:1>)) for each of the bypass switches based on the received delay code. In this example, the controller 865 is an n to 2$^n$ binary decoder.

The delay line bias circuit 850 also includes a calibration transistor (MN1) 861. As shown in FIG. 8, the resistance value of the resistor bank 860 sets the current through the calibration transistor (MN1) 861. The delay line bias circuit sets a first-bias-voltage signal (VBP) 855 and a second-bias-voltage signal (VBN) 856 based on the current through the calibration transistor (MN1) 861. It will be appreciated that this functionality can be implemented in a number of different ways, and that the circuit that is shown in FIG. 8 is a non-limiting example of a suitable implementation.

It is recalled from FIG. 7 that the VCDL includes a plurality of delay buffers that are connected in series to successively apply a time delay to the clock-in signal. The magnitude of the time delay that is applied by each delay buffer is based on the first-bias-voltage signal (VBP) 855 and the second-bias-voltage signal (VBN) 856. An example of a delay buffer 851 is shown in FIG. 8. The delay buffer 851 that is shown in FIG. 8 illustrates how the first-bias-voltage signal (VBP) 855 and the second-bias-voltage signal (VBN) 856 affect the time delay that is applied by the delay buffer 851. If resistor value in series will increase from low to high by switches <2$^n$:1> being enabled, then the current through MN1 will go from high to low, and same through MN2 and MP3. As MN2 and MP3 are diode connected, so the voltage over VBN will go from high to low, and the voltage over VBP will go from low to high. Hence, Ron resistance of MP3 & MN2 will increase from low to high, so that this increment of Ron resistance of MP3 & MN3 will induce more delay in each delay buffer in the VCDL. This will result in PH<N> being more delayed and therefore shifted towards 2Π radians from Ph<0>.

In this way, the resistor bank 860 can be used to control current across process and voltage, as well as local mismatch, through the calibration (MN1) transistor 861 during calibration. This calibrated current generates calibrated voltage signals (VBN and VBP) 855, 856 for nmos and pmos devices, respectively, in the delay buffers. In turn, this controls the Ron resistance of MN2 and MP2. (As is known in the art, "Ron" is the resistance of a FET when the FET is on.) Controlling the Ron resistance in this way varies the time delay that is applied by the delay buffers during calibration.

Figure 9:
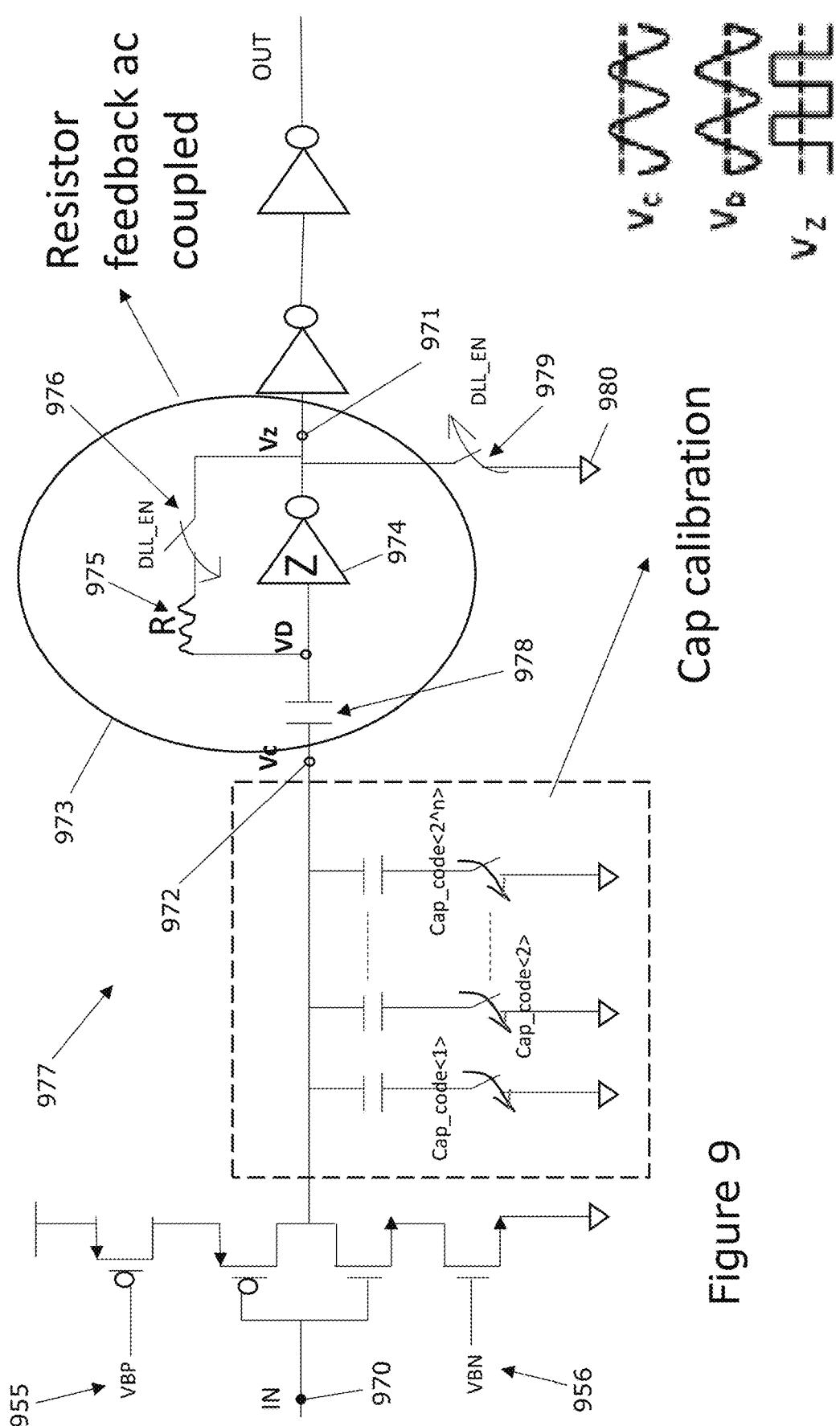
FIG. 9 illustrates an example embodiment of a delay buffer according to the present disclosure.

FIG. 9 illustrates an example embodiment of a delay buffer 977 according to the present disclosure. The delay buffer 977 of FIG. 9 can be used in any of the DLL circuits disclosed herein.

The delay buffer 977 has: an input terminal 970; an output terminal 971; and an intermediate terminal (Vc) 972.

The delay buffer 977 also has a duty cycle distortion reduction circuit 973 that is connected in series between the intermediate terminal (Vc) 972 and the output terminal 971. The duty cycle distortion reduction circuit 971 includes an ac-coupled capacitor 978, an inverter 974 and a feedback resistor 975. The ac-coupled capacitor 978 and the inverter 974 are in series with each between the intermediate terminal (Vc) 972 and the output terminal 971. The inverter 974 has an inverter-input-terminal and an inverter-output-terminal. The feedback resistor 975 is in series between the inverter-input-terminal and the inverter-output-terminal.

If there is a high RC load@locked condition (i.e., when the the delay code setter applies the selected-delay-code to the VCDL), the voltage swing at the intermediate node (Vc) 972 may be reduced to such an extent that the DC voltage at the intermediate node (Vc) 972 may be shifted away from a switching threshold due to process variation. Such a reduced swing and a shifted DC voltage at the intermediate node (Vc) 972 can lead to severe duty cycle distortion or even failure to switch at all at the output terminal 972 of the delay buffer 971. These issues (i.e., distortion and/or dead clock) can be be more severe as the pulse leads from PH<0> to PH<N>.

A distorted duty cycle clock can introduce jitter in the VCDL and/or it can increase the likelihood of dead clock outputs occurring over multiple phases.

This problem can be addressed by introducing the duty cycle distortion reduction circuit 971 of FIG. 9. The duty cycle distortion reduction circuit 971 can be referred to as an ac coupled resistor feedback circuit, And it can achieve improved DC biasing at the input terminal of the inverter 974, which leads amplification of the signal by the inverter 974 with reduced duty cycle distortion.

In the example of FIG. 9, the duty cycle distortion reduction circuit 971 also includes two enable circuits that are operated by a signal that is labelled in FIG. 9 as DLL_EN. This signal is described above with reference to FIG. 2 in particular. A first enable switch 976 is provided in series with the feedback resistor 975 between the inverter-input-terminal and the inverter-output-terminal. A second enable switch 979 is provided in series between the inverter-output-terminal and a ground terminal 981. These two switches 976, 979 can reduce noise amplification by the inverter 974. Otherwise, the inverter 974 may behave as a ring oscillator even if the DLL is disabled (power down mode) and generate all phases ph<0> to ph<N> with random frequency. Also, the VCDL consume power even if the DLL is disabled.

One or more of the examples described herein can provide the following advantages:

Vcntrl can be limited by using an in-built DLL sub block; i.e., a delay buffer/line and a phase detector.

A wide range of frequencies for the same DLL can be supported.

No extra power is consumed in normal operation because an in-built sub-block is used for the calibration.

Less jittery, compared to the prior art.

If a highly precise Vcntrl is required, then there can be no or minimal impact over power and jitter.

Examples described herein can relate to one or more of the following aspects:

1. Before start changing RC delay inside VCDL while calibration in open loop (FIG. 2), first RSTGEN can be active by forcing reset_sw=0→1 until DOWN width>UP width, thereby keeping control voltage vcntrl at VDD/2 or any predetermined fixed voltage, and then again disable RSTGEN.

2. To achieve a good range of vcntrl over temp (again, FIG. 2), calibration can be done by fixing control voltage at VDD/2 or any predetermined fixed voltage and then imposing multiple RC delays by using delay line bias's resistor divider (FIG. 8) in delay lines (VCDL) until UP width>DOWN width of the phase detector in open loop. Hence, calibration can be done by using a calibration circuit (FIG. 2) plus in-built sub-blocks of the DLL (delay line bias+VCDL+PD) over process, supply voltage and local mismatch.

3. Vcntrl will be locked at very close to the predetermined fixed voltage in the closed loop over process, supply and local mismatch variation to generate equally spaced multiple phases in one clk time period. Hence, vcntrl range can provide a large range of temperature tracking in closed loop operation.

4. Hence, one or more of the examples of calibration that are described herein can support a wide frequency range of DLL.

In addition to the calibration that is outlined above, the present disclosure also relates to:

1. A delay line bias circuit (FIG. 8) used in calibration (open loop) to generate multiple delays in the VCDL by varying resistor calibration, which is also used in closed loop to control delay over temp by varying vcntrl when enter under normal functionality by using a charge pump and a phase detector.

2. A duty cycle free delay unit by using a resistor feedback AC coupled inverter, which can help to reduce jitter coming from duty cycle distortion and even reduce the chances of a dead clock if a high delay is required between consecutive phases (FIG. 9).

The present disclosure describes a highly efficient, precise and novel approach for gain calibration of a delay line.

Advantageously, the DLL circuits described herein can provide precise calibration for the control voltage signal by varying RC delay across process, voltage and local mismatch during a calibration mode of operation before entering a locked condition in a closed loop configuration during an active mode of operation. Due to a limited range of the control voltage signal (Vcntrl), for instance it cannot fall outside of a range defined by ground and the supply voltage (VDD), the value of the control voltage signal that is applied to the voltage controlled delay line should stay within those limits across expected PVT variations.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/ method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A delay locked loop circuit comprising:
a voltage-controlled delay line that comprises one or more variable components, wherein the voltage-controlled delay line is configured to:
receive a clock-in signal;
receive a control-voltage signal; and
apply a time delay to the clock-in signal in order to provide a first output signal and a last output signal, wherein a magnitude of the time delay is based on the control-voltage signal and a delay code, and wherein the delay code defines values of the one or more variable components in the voltage-controlled delay line;
a phase detector circuit that is configured to process the first output signal and the last output signal in order to provide: i) an up-pulse signal; and ii) a down-pulse signal, wherein the difference between a width of the up-pulse signal and a width of the down-pulse signal represent the phase difference between the first output signal and the last output signal;
a charge pump that is configured to provide a feedback voltage signal based on the up-pulse signal and the down-pulse signal;
a phase signal processor that is configured to process the up-pulse signal and the down-pulse signal in order to provide a delay code locking signal, which is representative of whether or not the first output signal is 2Π radians out of phase with the last output signal;
a delay code setter that is configured to provide a delay code setting signal that represents one of a sequence of different candidate delay codes;
a fixed voltage source that is configured to provide a fixed voltage signal; and
a switching circuit that is configured to put the delay locked loop circuit in either an active mode of operation or a calibration mode of operation, wherein:
when the delay locked loop circuit is in the calibration mode of operation:
the fixed voltage source is configured to provide the fixed voltage signal as the control-voltage signal for the voltage-controlled delay line;
while the delay code locking signal represents the first output signal not being 2Π radians out of phase with the last output signal: the delay code setter is configured to apply the delay code setting signal to the voltage-controlled delay line such that it sequentially applies different candidate delay codes to the voltage-controlled delay line as an active candidate delay code; and
when the delay code locking signal represents the first output signal being 2Π radians out of phase with the last output signal: the delay code setter is configured to assign the active candidate delay code as a selected-delay-code;
when the delay locked loop circuit is in the active mode of operation:
the charge pump is configured to provide the feedback voltage signal as the control-voltage signal for the voltage-controlled delay line; and
the voltage-controlled delay line is configured to use the selected-delay-code as the delay code; and
wherein the voltage-controlled delay line comprises:
a delay line bias circuit, wherein:
the delay line bias circuit includes a resistor bank;
the resistor bank comprises a plurality of resistors that are connected in a series arrangement between a resistor-bank-connection node and a ground terminal, wherein the resistor bank has a resistance value that affects the magnitude of the time delay that is applied by the voltage-controlled delay line;
the delay line bias circuit includes a plurality of bypass switches, each of the plurality of bypass switches being associated with a respective resistor in the resistor bank;
each bypass switch is configured to selectively include or exclude its associated resistor in the series arrangement between the resistor-bank-connection node and the ground terminal in order to set the resistance value of the resistor bank based on a resistive-code signal; and
the delay line bias circuit comprises a controller that provides the resistive-code signals for each of the bypass switches based on the delay code.

2. The delay locked loop circuit of claim 1, wherein the delay code setter is configured to apply the delay code setting signal to the voltage-controlled delay line such that it applies a sequence of candidate delay codes through which application the value of the delay code is gradually increased until the last output signal is at least 2Π radians out of phase with the first output signal.

3. The delay locked loop circuit of claim 1, wherein the phase signal processor comprises a D-type flip flop which has: a data input terminal, a clock input terminal, and an output terminal, wherein:

the data input terminal is configured to receive one of the up-pulse signal and the down-pulse signal;

the clock input terminal is configured to receive the other one of the up-pulse signal and the down-pulse signal; and the output terminal is configured to provide the delay code locking signal.

4. The delay locked loop circuit of claim 3, wherein the D-type flip flop further comprises an enable input terminal, and wherein:

the enable input terminal is configured to receive an enable input signal when the delay locked loop circuit is in the calibration mode of operation; and the enable input terminal is configured to receive a disable input signal when the delay locked loop circuit is in the active mode of operation.

5. The delay locked loop circuit of claim 1, wherein the phase detector is a proportional phase detector.

6. The delay locked loop circuit of claim 1, further comprising:

a reset generator that is configured to ensure that the delay code setter receives a first rising edge of the last output signal before the corresponding rising edge of the first output signal before the delay code setter sequentially applies the different candidate delay codes to the voltage-controlled delay line.

7. The delay locked loop circuit of claim 1, wherein:

the voltage-controlled delay line comprises a plurality of delay buffers that are connected in series to successively apply a time delay to the clock-in signal;

the output of a first delay buffer of the plurality of delay buffers is the first output signal;

the output of a last delay buffer of the plurality of delay buffers is the last output signal; and the magnitude of the time delay that is applied by each delay buffer of the plurality of delay buffers is based on a bias-voltage signal;

the delay line bias circuit further comprises a calibration transistor;

the resistance value of the resistor bank is configured to set a current through the calibration transistor; and the delay line bias circuit is configured to set the bias-voltage signal based on the current through the calibration transistor.

8. The delay locked loop circuit of claim 1, wherein:

the voltage-controlled delay line comprises a plurality of delay buffers that are connected in series to successively apply a time delay to the clock-in signal;

each of the plurality of delay buffers has:

an input terminal;

an output terminal;

an intermediate terminal; and a duty cycle distortion reduction circuit that is connected in series between the intermediate terminal and the output terminal;

the duty cycle distortion reduction circuit comprises:

an ac-coupled capacitor and an inverter in series with each between the intermediate terminal and the output terminal, wherein the inverter has an inverter-input-terminal and an inverter-output-terminal; and a feedback resistor in series between the inverter-input-terminal and the inverter-output-terminal.

9. The delay locked loop circuit of claim 8, wherein the duty cycle distortion reduction circuit further comprises:

a first enable switch in series with the feedback resistor between the inverter-input-terminal and the inverter-output-terminal; and a second enable switch in series between the inverter-output-terminal and a ground terminal.

* * * * *